United States Patent
Ito et al.

(10) Patent No.: US 12,151,941 B2
(45) Date of Patent: Nov. 26, 2024

(54) SIC SUBSTRATE AND SIC INGOT

(71) Applicant: Resonac Corporation, Tokyo (JP)

(72) Inventors: Masato Ito, Ichihara (JP); Hiromasa Suo, Ichihara (JP)

(73) Assignee: Resonac Corporation, Tokyo (JP)

( * ) Notice: Subject to any disclaimer, the term of this patent is extended or adjusted under 35 U.S.C. 154(b) by 13 days.

(21) Appl. No.: 18/175,134

(22) Filed: Feb. 27, 2023

(65) Prior Publication Data
US 2023/0391626 A1  Dec. 7, 2023

(30) Foreign Application Priority Data
Jun. 2, 2022 (JP) ................ 2022-090458

(51) Int. Cl.
  *C01B 32/956* (2017.01)

(52) U.S. Cl.
  CPC ........ *C01B 32/956* (2017.08); *C01P 2006/60* (2013.01); *C01P 2006/80* (2013.01)

(58) Field of Classification Search
  None
  See application file for complete search history.

(56) References Cited

U.S. PATENT DOCUMENTS

| 2007/0262322 A1* | 11/2007 | Nakabayashi .......... C30B 23/00 117/85 |
| 2021/0148006 A1* | 5/2021 | Vogel ..................... C30B 23/00 |

FOREIGN PATENT DOCUMENTS

| JP | 2001-226199 A | | 8/2001 |
| JP | 2007-320790 A | | 12/2007 |
| JP | 2010-150133 A | | 7/2010 |
| JP | 2010-254520 A | | 11/2010 |
| JP | 2010-254521 A | | 11/2010 |
| JP | 2013-100217 A | | 5/2013 |
| JP | 2013-211500 A | | 10/2013 |
| JP | 2014004628 A | * | 1/2014 |
| JP | 2020-511391 A | | 4/2020 |

OTHER PUBLICATIONS

Machine Translation of JP 2014004628 (Year: 2014).*
P.J. Wellman, et al., "Optical quantitative determination of doping levels and their distribution in SiC", ELSEVIER, Materials Science and Engineering, pp. 75-78, (2002), B91-92.

* cited by examiner

*Primary Examiner* — Colin W. Slifka
*Assistant Examiner* — Michael Forrest
(74) *Attorney, Agent, or Firm* — Sughrue Mion, PLLC

(57) ABSTRACT

In a SiC substrate according to the present embodiment, a proportion of a first region in which a difference between a maximum value and a minimum value of absorption coefficient for light having a wavelength of 1064 nm is 0.25 $cm^{-1}$ or less is 70% or more of the total area.

13 Claims, 3 Drawing Sheets

SIC SUBSTRATE AND SIC INGOT

BACKGROUND OF THE INVENTION

Field of the Invention

The present invention relates to a SiC substrate and a SiC ingot.

Priority is claimed on Japanese Patent Application No. 2022-090458, filed Jun. 2, 2022, the content of which is incorporated herein by reference.

Description of Related Art

Silicon carbide (SiC) has a dielectric breakdown field one order of magnitude larger and a bandgap three times larger than silicon (Si). In addition, silicon carbide (SiC) has properties such as a thermal conductivity about three times higher than silicon (Si). Therefore, silicon carbide (SiC) is expected to be applied to power devices, high-frequency devices, high-temperature operation devices, and the like. For this reason, in recent years, SiC epitaxial wafers have come to be used for the above-described semiconductor devices.

A SiC epitaxial wafer is obtained by laminating a SiC epitaxial layer on the surface of a SiC substrate. Hereinafter, the substrate before lamination of the SiC epitaxial layer is referred to as a SiC substrate, and the substrate after lamination of the SiC epitaxial layer is referred to as a SiC epitaxial wafer. The SiC substrate is cut out from a SiC ingot.

Patent Document 1 discloses a SiC substrate in which a difference in average absorption coefficient between a peripheral region and an inner region is set to 10 cm-1 or less in order to avoid crystal defects during crystal growth.

PATENT DOCUMENTS

[Patent Document 1] Published Japanese Translation No. 2020-511391 of the PCT International Publication

SUMMARY OF THE INVENTION

In recent years, laser processing of a SiC single crystal has been carried out. For example, the SiC single crystal can be divided by creating a crack on the SiC single crystal with a laser. For example, laser processing is used when cutting out a SiC substrate from a SiC ingot, when cutting out a thinner substrate from the SiC substrate, and when chipping the SiC substrate. Laser processing has an advantage of less cutting loss than processing using a wire saw, but may result in a rough cut surface or unexpected rupture.

The present invention has been made in view of the above problems, and an object of the present invention is to provide a SiC substrate and a SiC ingot that are easy to process during laser processing.

The present inventors have produced a SiC substrate and a SiC ingot of which an in-plane variation of an absorption coefficient for laser light is small and have found that a processing success rate increases using them. The present invention provides the following means to solve the above problems.

A first aspect of the present invention provides the following SiC substrate.
  (1) In a SiC substrate according to the first aspect, a proportion of a first region, in which a difference between a maximum value and a minimum value of absorption coefficient for light having a wavelength of 1064 nm is in a range of 0.25 $cm^{-1}$, is 70% or more of a total area thereof.

The SiC substrate of the first aspect of the present invention preferably has the following features (2) to (10). Combinations of two or more of the following features are also preferable.
  (2) In the SiC substrate according to the above aspect, the proportion of the first region may be 80% or more of the total area.
  (3) In the SiC substrate according to the above aspect, the proportion of the first region may be 90% or more of the total area.
  (4) In the SiC substrate according to the above aspect, the proportion of the first region may be 95% or more of the total area.
  (5) In the SiC substrate according to the above aspect, a diameter of the SiC substrate may be 149 mm or more.
  (6) In the SiC substrate according to the above aspect, a diameter of the SiC substrate may be 199 mm or more.
  (7) In the SiC substrate according to the above aspect, a maximum absorption coefficient of the SiC substrate for light having a wavelength of 1064 nm may be 3.00 $cm^{-1}$ or less.
  (8) In the SiC substrate according to the above aspect, a maximum absorption coefficient of the SiC substrate for light having a wavelength of 1064 nm may be 2.75 $cm^{-1}$ or less.
  (9) In the SiC substrate according to the above aspect, the substrate may include a portion other than a high nitrogen concentration region called a facet, the substrate may include a dopant for determining a conductivity type and a dopant that is incorporated as an impurity, and the dopant for determining a conductivity type may be nitrogen.
  (10) In the SiC substrate according to the above aspect, the proportion of the first region to the total area thereof may be obtained by dividing number of measurement points, at which absorption coefficient is within ±0.125 $cm^{-1}$ of an average value of absorption coefficients of total measurement points, wherein measurement thereof is performed in one direction with a spot diameter of 1 mm and a measurement interval of 10 mm at the measurement points, by number of the total measurement points, and multiplying the divided value by 100.

A second aspect of the present invention provides the following SiC ingot.
  (11) In a SiC ingot according to the second aspect, when cutting out a SiC substrate therefrom and evaluating a cut surface thereof, a proportion of a first region, in which a difference between a maximum value and a minimum value of absorption coefficient for light having a wavelength of 1064 nm is in a range of 0.25 $cm^{-1}$, is 70% or more of the total area of the cut surface.

The SiC ingot of the second aspect of the present invention preferably has the following features (12) and (13). A combination of the following features is also preferable.
  (12) In the SiC ingot according to the above aspect, the ingot may include a portion other than a high nitrogen concentration region called a facet, the ingot may include a dopant for determining a conductivity type and a dopant that is incorporated as an impurity, and the dopant for determining a conductivity type may be nitrogen.
  (13) In the SiC ingot according to the above aspect, the proportion of the first region to the total area thereof may be obtained by dividing number of measurement points, at which absorption coefficient is within ±0.125 cm$^{-1}$ of an average value of absorption coefficients of total measurement points, wherein measurement thereof is performed in one direction with a spot diameter of 1 mm and a measurement interval of 10 mm at the measurement points, by number of the total measurement points, and multiplying the divided value by 100.

The SiC ingot of the second aspect of the present invention may be used for manufacturing the SiC substrate of the first aspect of the present invention.

The SiC substrate and SiC ingot according to the above aspects are easy to process during laser processing.

DETAILED DESCRIPTION OF THE INVENTION

Figure 1:
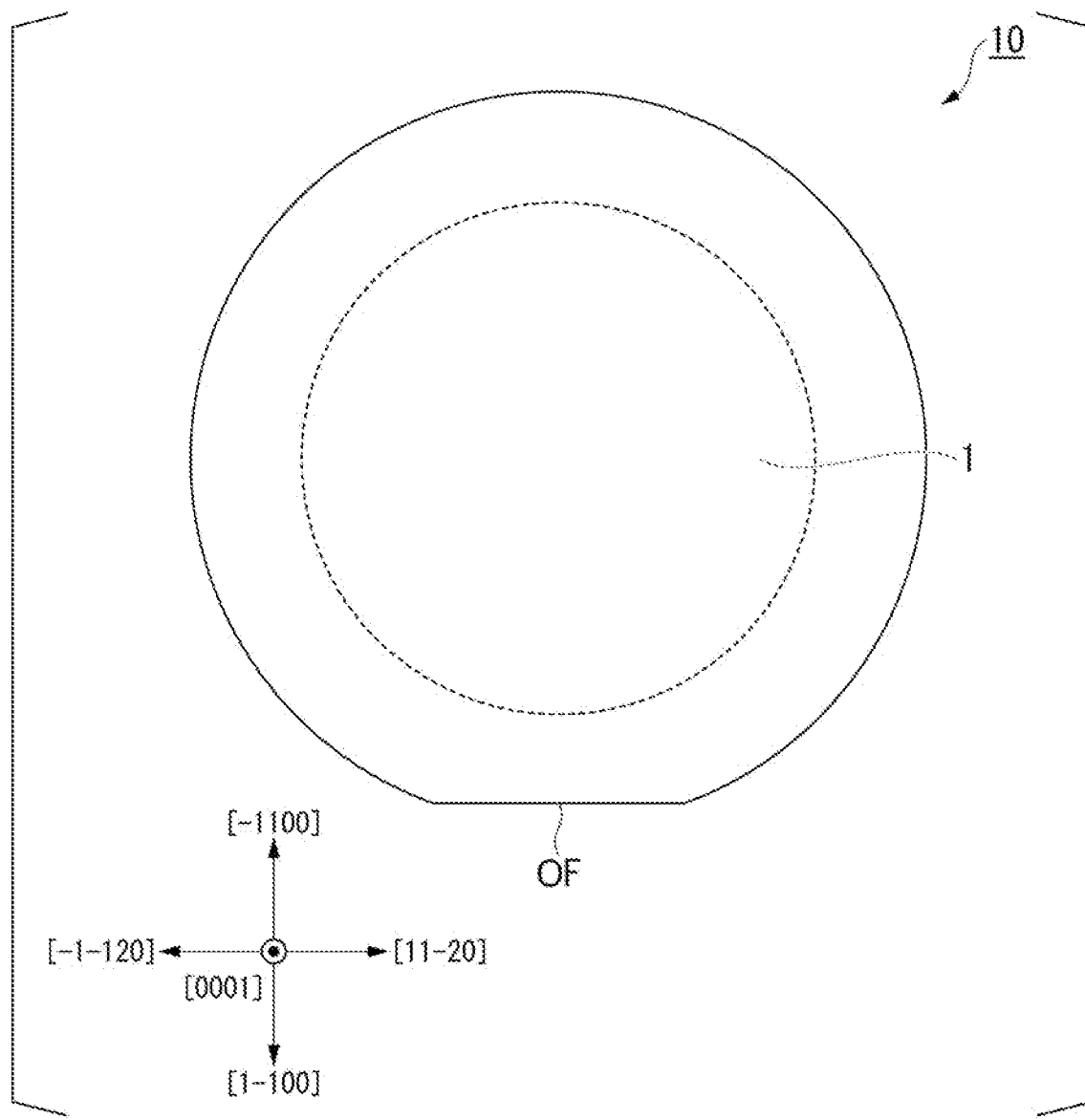
FIG. 1 is a schematic plan view of a SiC substrate according to the present embodiment.

Hereinafter, a SiC substrate and the like according to the present embodiment will be described in detail with reference to the drawings as appropriate. In the drawings which will be used in the following description, featured portions may be enlarged for convenience in order to make the features of the present embodiment easy to understand, and the dimensional ratios of constituent elements may be different from the actual ones. The materials, dimensions, and the like which will be exemplified in the following description are examples, and the present invention is not limited thereto and can be appropriately modified and carried out without changing the gist of the present invention. For example, numbers, shapes, types, positions, amounts, ratios, materials, members, configurations, or the like may be added, omitted, replaced, or changed without departing from the gist of the present invention.

FIG. 1 is a plan view of a SiC substrate 10 according to the present embodiment. The SiC substrate 10 is made of, for example, n-type SiC. The polytype of the SiC substrate 10 is not particularly limited and may be any of 2H, 3C, 4H, and 6H. The SiC substrate 10 is, for example, 4H—SiC.

The planar view shape of the SiC substrate 10 is substantially circular. The SiC substrate 10 may have an orientation flat OF or a notch for identifying the direction of a crystal axis. The diameter of the SiC substrate 10 is, for example, 149 mm or more, preferably 199 mm or more. As the diameter of the SiC substrate 10 is larger, it is more difficult to stably cut the SiC substrate 10 by laser processing. Therefore, the SiC substrate 10 that satisfies the configuration of the present embodiment is more useful as the diameter is larger. The thickness of the SiC substrate 10 can be arbitrarily selected, and examples thereof include 100 to 300 μm, 300 to 400 μm, 400 to 500 μm, and 500 to 600 μm, but the thickness is not limited to these examples.

The SiC substrate 10 according to the present embodiment has a first region 1. In the first region 1, a difference between a maximum value and a minimum value of absorption coefficient for light having a wavelength of 1064 nm is 0.25 cm$^{-1}$ or less. In FIG. 1, the first region 1 is illustrated as a circle having the same center as the SiC substrate 10, but the present invention is not limited to this example. For example, the center of the first region 1 and the center of the SiC substrate 10 may be deviated from each other, and the shape of the first region 1 may be irregular. Hereinafter, the absorption coefficient α is a value at a temperature condition of 300 K.

The absorption coefficient α is obtained from the absorptance A of the SiC substrate 10 with respect to light having a wavelength of 1064 nm and the thickness L of the SiC substrate 10. The absorptance A of the SiC substrate 10 for light having a wavelength of 1064 nm can be obtained by A=1−T−R from the reflectance T and the transmittance R. The reflectance T is obtained by T=$I_1/I_0$ using the intensity $I_0$ of incident light to the SiC substrate 10 and the intensity $I_1$ of reflected light from the SiC substrate 10. The transmittance R is obtained by R=$I_2/I_0$ using the intensity $I_0$ of incident light to the SiC substrate 10 and the intensity $I_2$ of transmitted light that is transmitted through the SiC substrate 10. Further, since the absorptance A can be expressed as A=exp(−α·L), the absorption coefficient α can be obtained from the absorptance A and the thickness L of the SiC substrate 10.

By obtaining the absorption coefficient α at each point in the plane of the SiC substrate 10, the in-plane distribution of the absorption coefficient α can be obtained. For example, when measuring the in-plane distribution of the absorption coefficient α, the spot diameter of each measurement point is set to 1 mm, and the interval between adjacent measurement points is set to 10 mm. When the number of measurement points is X and the number of measurement points at which the absorption coefficient is within $α_0$±0.125 cm$^{-1}$ is Y, a proportion Z of the first region 1 with respect to the total area of the SiC substrate 10 can be obtained by Z=Y/X× 100(%). $α_0$ can be, for example, the average value of the absorption coefficients of the total measurement points, but can be freely selected to maximize Z.

The proportion of the first region 1 with respect to the total area of the SiC substrate 10 is, for example, 70% or more. In addition, the proportion of the first region 1 with respect to the total area of the SiC substrate 10 is preferably 80% or more, more preferably 90% or more, and further preferably 95% or more. Although the upper limit of the proportion can be arbitrarily selected, it may be, for example, 100% or less, 99% or less, or 98% or less.

As the proportion of the first region 1 with respect to the total area of the SiC substrate 10 increases, it is possible to prevent the surface roughness of the cut surface cut by laser processing from becoming rough and unexpected rupture from occurring on the SiC substrate 10 during cutting by laser processing. This is because the in-plane variation in the absorption coefficient of laser light is small, and thus laser processing is stabilized. Laser light of an yttrium, aluminum, and garnet (YAG) laser, which is often used in laser processing, has a wavelength of 1064 nm.

Figure 2:
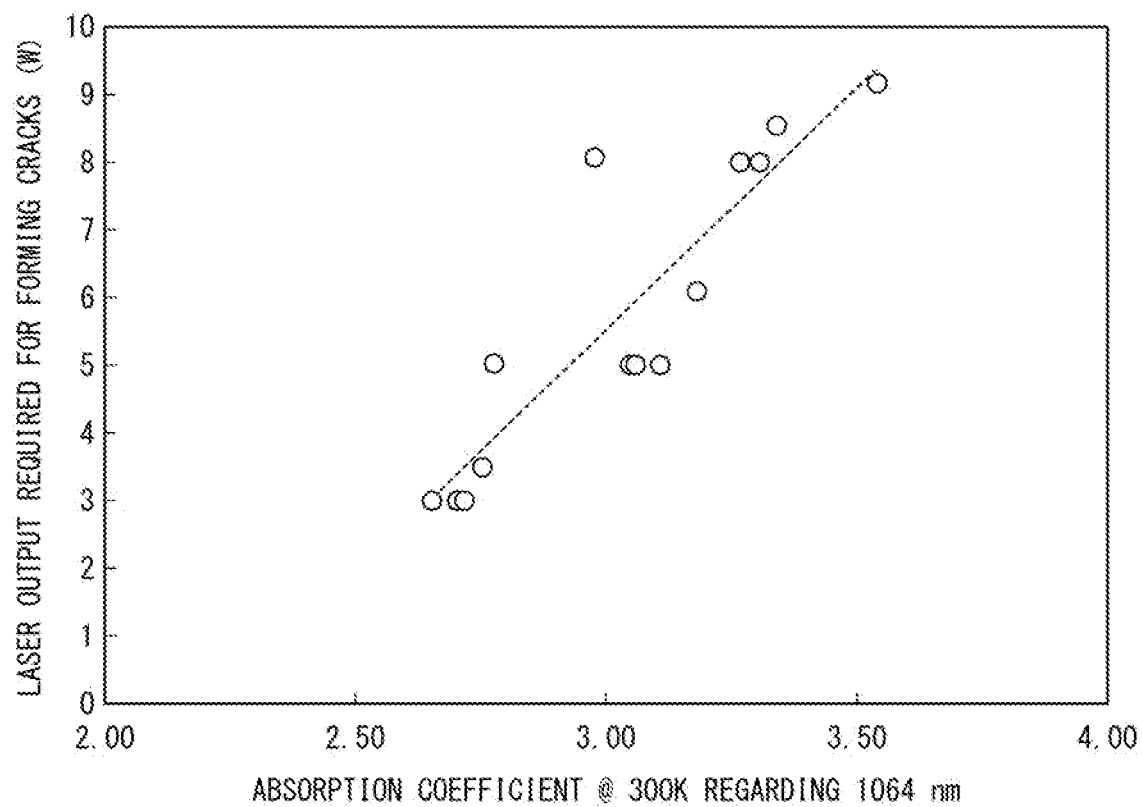
FIG. 2 is a graph showing the relationship between the absorption coefficient of a SiC substrate and the laser output required to create a crack on the SiC substrate.

FIG. 2 is a graph showing the relationship between the absorption coefficient of the SiC substrate 10 and the laser output required to create a crack on the SiC substrate 10. As shown in FIG. 2, as the absorption coefficient of the SiC substrate 10 increases, the laser output required to create a crack increases. As shown in FIG. 2, if the difference in absorption coefficient is within the range of 0.25 cm$^{-1}$, that is, 0.25 cm$^{-1}$ or less, it is possible to create a crack on the SiC substrate 10 with a constant laser output. When the laser output does not fluctuate during cutting, it is possible to prevent the surface roughness of the cut surface from becoming rough and the unexpected rupture from occurring.

The maximum absorption coefficient of the SiC substrate 10 for light having a wavelength of 1064 nm is, for example, 3.00 cm$^{-1}$ or less, and preferably 2.75 cm$^{-1}$ or less. The absorption coefficient increases as the concentration of the impurity contained in the SiC substrate 10 increases. As described above, as the absorption coefficient of the SiC substrate 10 increases, the laser output required to create a crack increases. Therefore, the SiC substrate 10 with a small maximum absorption coefficient can be processed with less energy.

Here, the cutting of the SiC substrate 10 is performed, for example, in a case where the SiC substrate 10 is made into chips, a thinner substrate is cut out from the SiC substrate 10, or the like.

Next, an example of a method for manufacturing the SiC substrate 10 according to the present embodiment will be described. The SiC substrate 10 is obtained by slicing a SiC ingot. The SiC ingot is obtained, for example, by a sublimation method. The SiC substrate 10 according to the present embodiment can be produced by controlling the growth conditions of the SiC ingot.

Figure 3:
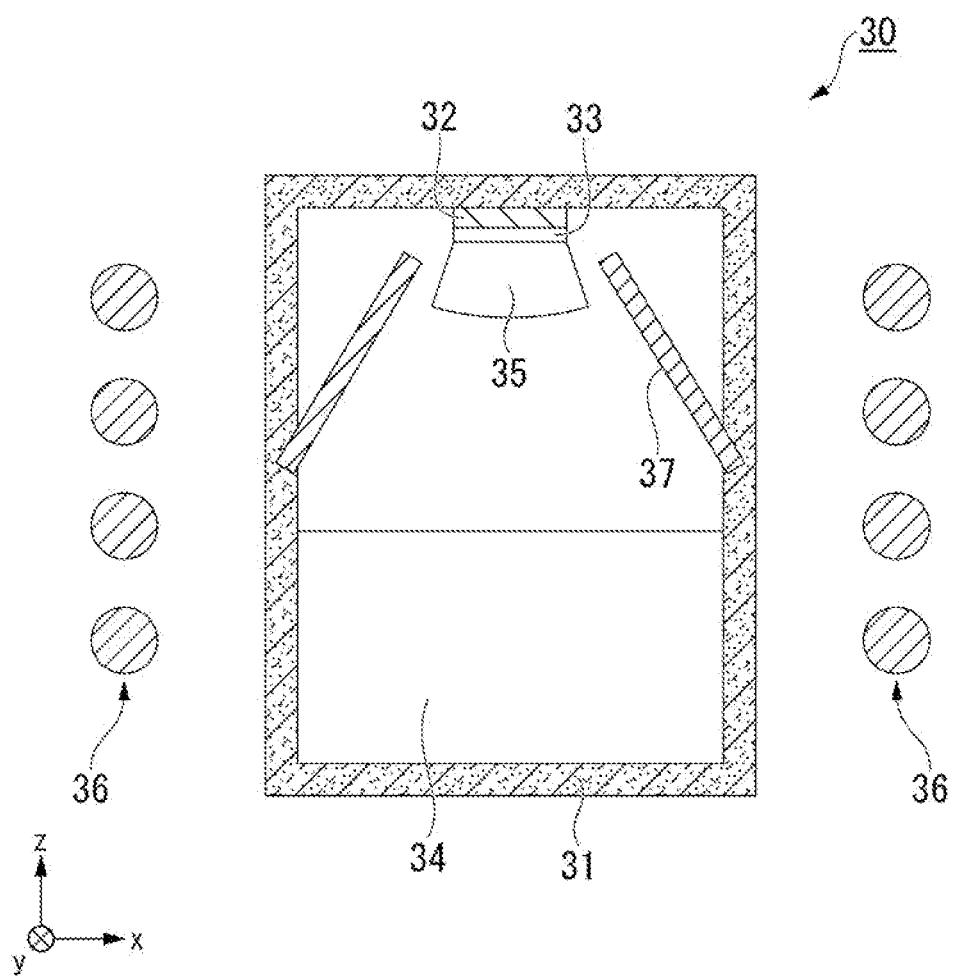
FIG. 3 is a schematic view for explaining a sublimation method, which is an example of a manufacturing apparatus for a SiC ingot.

FIG. 3 is a schematic view for explaining a sublimation method, which is an example of a manufacturing apparatus 30 for the SiC ingot. In FIG. 3, a direction orthogonal to the surface of a pedestal 32 is referred to as a z direction, one direction orthogonal to the z direction is referred to as an x direction, and a direction orthogonal to the z direction and the x direction is referred to as a y direction.

The sublimation method is a method in which a seed crystal 33 made of a SiC single crystal is disposed on the pedestal 32 disposed in a crucible 31 made of graphite, the crucible 31 is heated to sublimate a sublimation gas from raw material powder 34 in the crucible 31, and the sublimation gas is supplied to the seed crystal 33 to grow the seed crystal 33 into a larger SiC ingot 35. The seed crystal 33 is, for example, a SiC single crystal having an offset angle of 4 degrees with respect to the [11-20] direction and is placed on the pedestal 32 with a C plane as a growth plane.

For example, a heat insulating material may be disposed around the crucible 31. The crucible 31 is disposed inside a double quartz tube, for example. Argon gas and dopant gas (nitrogen gas) are supplied to the inside of the double quartz tube, and the pressure is controlled by exhausting with a vacuum pump. A coil 36 is disposed outside the double quartz tube, and a high-frequency current is applied to the coil 36 to heat the crucible 31.

A taper member 37 that expands in diameter from the pedestal 32 toward the inner wall of the crucible 31 may be disposed inside the crucible 31. It is possible to increase the diameter of the single crystal in crystal growth by using the taper member 37. By performing crystal growth under the condition that the diameter thereof is expanding, it is possible to dispose a high nitrogen concentration region, which is called a facet, outside a region which is effective when the SiC substrate 10 is obtained from the SiC ingot 35.

It is possible to produce the SiC substrate 10 with small in-plane variation in absorption coefficient by repeating a process of producing the SiC ingot 35, cutting out the SiC substrate 10 therefrom, measuring the SiC substrate 10, and feeding back the measurement results a plurality of times, and by changing the growth conditions of the SiC ingot 35. The growth conditions to be changed are, for example, the temperature distribution and the concentration distribution of impurities contained in the raw material powder 34, which are used when the SiC ingot 35 is produced.

When the SiC ingot 35 is produced, the temperature of the outer peripheral portion of the SiC ingot 35 in an xy direction is made higher than that of the inside thereof, and the concentration of impurities on the outer peripheral side of the raw material powder 34 in the xy direction is made higher than that of the inside thereof.

The impurities contained in the SiC ingot 35 include nitrogen that is intentionally introduced as an n-type dopant and impurities that are unintentionally taken into the crystal from furnace members and the raw material powder 34. The impurities unintentionally contained in the crystal are, for example, boron, aluminum, titanium, vanadium, and the like.

The routes for introducing the impurities into the SiC ingot 35 include, for example, a first route, a second route, and a third route. The first route is a route through which the dopant gas passes through the side wall of the crucible 31 and is introduced into the SiC ingot 35. The second route is a route through which impurities contained in a gas in degassing from members included in the crucible 31 are introduced into the SiC ingot 35. The third route is a route through which impurities contained in the raw material powder 34 are introduced into the SiC ingot 35.

In the first route and the second route, impurities are introduced into the SiC ingot 35 from outside in the xy direction. Therefore, unless the manufacturing conditions are controlled, the outer peripheral portion of the SiC ingot 35 tends to have a higher impurity concentration than the inner portion thereof. By raising the temperature of the outer peripheral portion of the SiC ingot 35, it is possible to reduce impurities introduced into the outer peripheral portion through the first route or the second route.

On the other hand, in the third route, impurities are introduced into the SiC ingot 35 from below in the z direction. If the temperature of the outer peripheral portion of the SiC ingot 35 is made higher than that of the inside thereof in order to reduce the amount of impurities introduced into the outer peripheral portion through the first or second route, the amount of impurities introduced into the outer peripheral portion through the third route is also less than that of the inside thereof. As a result, the impurities introduced into the SiC ingot 35 through the third route vary within the xy plane. Therefore, even in a case where the temperature of the outer peripheral portion of the SiC ingot 35 is made higher than that of the inside, it is possible to reduce the in-plane variation of the impurities introduced into the SiC ingot 35 in the xy direction by increasing the concentration of the impurities on the outer peripheral side of the raw material powder 34 in the xy direction compared to that of the inside thereof.

The amount of dopant gas passing through the side wall of the crucible 31 and the amount of a gas in degassing from the members inside the crucible 31 differ for each crucible 31 and are not constant. Therefore, an appropriate temperature condition and an impurity concentration condition differ for each manufacturing apparatus. The temperature distribution of the SiC ingot 35 in the xy direction and the impurity concentration distribution of the raw material powder are optimized by repeating the feedback a plurality of times.

One that is measured during the feedback is the in-plane distribution of the absorption coefficient of the SiC substrate 10. The in-plane distribution of the absorption coefficient is measured according to the procedure described above. In a case where, in the SiC substrate 10, an area of a region in which a difference between a maximum value and a minimum value of absorption coefficient for light having a wavelength of 1064 nm is 0.25 cm$^{-1}$ or less is less than 70% of the total area, the manufacturing conditions are changed.

In this way, the crystal growth conditions of the SiC ingot 35 are determined by repeating the crystal growth of the SiC ingot 35 a plurality of times and feeding back each result. Then, it is possible to produce the SiC substrate 10 according to the present embodiment by producing the SiC ingot 35 under the determined growth conditions and cutting the SiC ingot 35.

As a specific example, the SiC substrate 10 according to the present embodiment may be obtained as follows. (i) In the temperature distribution at the time of SiC ingot manufacturing, the temperature of the outer peripheral portion of the SiC ingot 35 is made higher than that of the inside thereof, and in the impurity concentration distribution, the concentration of impurities on the outer peripheral side of the raw material powder 34 in the xy direction is made higher than that of the inside thereof, and the SiC ingot 35 is produced. (ii) The SiC substrate 10 is cut out from the obtained SiC ingot 35. (iii) The absorption coefficient of the cut out SiC substrate 10 is measured. (iv) (i) to (iii) are repeated a plurality of times while changing the temperature of the temperature distribution of the SiC ingot and the concentration of the impurity concentration distribution of the raw material powder in (i) according to the measured results until the SiC substrate 10 with the desired small in-plane variation is obtained.

In the SiC substrate 10 according to the present embodiment, an area of a region in which a difference between a maximum value and a minimum value of absorption coefficient for light having a wavelength of 1064 nm is 0.25 cm$^{-1}$ or less is 70% or more of the total area. Therefore, the SiC substrate 10 can be laser-processed with a constant laser output. When the laser output does not fluctuate during cutting, it is possible to prevent the surface roughness of the cut surface from becoming rough and the unexpected rupture from occurring.

Although a case of laser processing the SiC substrate 10 has been exemplified so far, the same applies to a case of laser processing the SiC ingot 35. For example, a case of cutting out the SiC substrate 10 from the SiC ingot 35 corresponds to the case of laser processing the SiC ingot 35. The state of the SiC ingot 35 is obtained by cutting out the SiC substrate 10 from the SiC ingot 35 and evaluating it. The state of the SiC ingot 35 is obtained by evaluating the cut surface of the cut out SiC substrate 10. Where the cut surface is to be taken depends on the type of substrate to be acquired, but for example, it is a plane tilted 4° from a (0001) plane with respect to the [11-20] direction. The target thickness of the SiC substrate is, for example, 400 μm.

In a case of laser processing the SiC ingot 35, when cutting out a SiC substrate and evaluating a cut surface thereof, a proportion of a first region in which a difference between a maximum value and a minimum value of absorption coefficient for light having a wavelength of 1064 nm is 0.25 cm$^{-1}$ or less is preferably 70% or more of the total area of the cut surface. In the cut surface, the proportion of the first region is more preferably 80% or more, further preferably 90% or more, and particularly preferably 95% or more of the total area. If the cut portion satisfies the above conditions, it is possible to prevent the surface roughness of the cut surface from becoming rough and the unexpected rupture from occurring during laser processing.

Further, the maximum absorption coefficient of the cut surface for light having a wavelength of 1064 nm is, for example, 3.00 cm$^{-1}$ or less, and preferably 2.75 cm$^{-1}$ or less.

As described above, the preferable embodiments of the present invention have been described in detail, the present invention is not limited to specific embodiments, and various modifications and changes can be made within the scope of the gist of the present invention described in the claims.

EXAMPLES

Example 1

A process of producing a SiC ingot, cutting out a SiC substrate, measuring the SiC substrate, and feeding back the measurement results was repeated a plurality of times, and the growth conditions of the SiC ingot was determined. A SiC substrate was produced by cutting the SiC ingot produced under the growth conditions.

In the produced SiC substrate, a proportion of a first region in which a difference between a maximum value and a minimum value of absorption coefficient for light having a wavelength of 1064 nm was 0.25 cm$^{-1}$ or less was 72% of the total area. This SiC substrate was irradiated with light from a laser. A YAG laser with a wavelength of 1064 nm was used as the laser.

When laser irradiation was performed on the SiC substrate of Example 1, it was possible to create a crack on the SiC substrate without generating rupture or fragment. Then, it was possible to divide the SiC substrate 10 into two in the thickness direction.

The present invention can provide a SiC substrate and a SiC ingot that are easy to process during laser processing.

EXPLANATION OF REFERENCES

1 First region
10 SiC substrate
30 Manufacturing apparatus
31 Crucible
32 Pedestal
33 Seed crystal
34 Raw material powder
35 SiC ingot
36 Coil
37 Taper member
OF Orientation flat

What is claimed is:

1. A SiC substrate, wherein a proportion of a first region, in which a difference between a maximum value and a minimum value of absorption coefficient for light having a wavelength of 1064 nm is in a range of 0.25 cm$^{-1}$, is 70% or more of a total area thereof.

2. The SiC substrate according to claim 1, wherein the proportion of the first region is 80% or more of the total area thereof.

3. The SiC substrate according to claim 1, wherein the proportion of the first region is 90% or more of the total area thereof.

4. The SiC substrate according to claim 1, wherein the proportion of the first region is 95% or more of the total area thereof.

5. The SiC substrate according to claim 1, wherein a diameter of the SiC substrate is 149 mm or more.

6. The SiC substrate according to claim 1, wherein a diameter of the SiC substrate is 199 mm or more.

7. The SiC substrate according to claim 1, wherein a maximum absorption coefficient of the SiC substrate for light having a wavelength of 1064 nm is 3.00 cm$^{-1}$ or less.

8. The SiC substrate according to claim 1, wherein a maximum absorption coefficient of the SiC substrate for light having a wavelength of 1064 nm is 2.75 cm$^{-1}$ or less.

9. The SiC substrate according to claim 1,
wherein the substrate includes a portion other than a high nitrogen concentration region called a facet,
wherein the substrate includes a dopant for determining a conductivity type and a dopant that is incorporated as an impurity, and
wherein the dopant for determining a conductivity type is nitrogen.

10. The SiC substrate according to claim 9, wherein the proportion of the first region to the total area thereof is obtained by
dividing number of measurement points, at which absorption coefficient is within ±0.125 cm$^{-1}$ of an average value of absorption coefficients of total measurement points, wherein measurement thereof is performed in one direction with a spot diameter of 1 mm and a measurement interval of 10 mm at the measurement points, by number of the total measurement points, and multiplying the divided value by 100.

11. A SiC ingot, wherein, when cutting out a SiC substrate therefrom and evaluating a cut surface thereof, a proportion of a first region, in which a difference between a maximum value and a minimum value of absorption coefficient for light having a wavelength of 1064 nm is in a range of 0.25 cm$^{-1}$, is 70% or more of a total area of the cut surface.

12. The SiC ingot according to claim 11,
wherein the ingot includes a portion other than a high nitrogen concentration region called a facet,
wherein the ingot includes a dopant for determining a conductivity type and a dopant that is incorporated as an impurity, and
wherein the dopant for determining a conductivity type is nitrogen.

13. The SiC ingot according to claim 12, wherein the proportion of the first region to the total area thereof is obtained by
dividing number of measurement points, at which absorption coefficient is within ±0.125 cm$^{-1}$ of an average value of absorption coefficients of total measurement points, wherein measurement thereof is performed in one direction with a spot diameter of 1 mm and a measurement interval of 10 mm at the measurement points, by number of the total measurement points, and multiplying the divided value by 100.

\* \* \* \* \*